US012740357B2

(12) United States Patent
Nishihara et al.

(10) Patent No.: US 12,740,357 B2
(45) Date of Patent: Sep. 15, 2026

(54) ETCHING METHOD AND ETCHING APPARATUS

(71) Applicant: SCREEN Holdings Co., Ltd., Kyoto (JP)

(72) Inventors: Kazuki Nishihara, Kyoto (JP); Yuya Akanishi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 788 days.

(21) Appl. No.: 18/160,939

(22) Filed: Jan. 27, 2023

(65) Prior Publication Data

US 2023/0290644 A1 Sep. 14, 2023

(30) Foreign Application Priority Data

Mar. 10, 2022 (JP) ................................. 2022-037020

(51) Int. Cl.
*H10P 50/28* (2026.01)
*H10P 70/00* (2026.01)
(Continued)

(52) U.S. Cl.
CPC ............ *H10P 50/283* (2026.01); *H10P 70/23* (2026.01); *H10P 74/20* (2026.01); *H10P 74/238* (2026.01)

(58) Field of Classification Search
None
See application file for complete search history.

(56) References Cited

U.S. PATENT DOCUMENTS 5,321,264 A * 6/1994 Kuwabara .............. G01B 11/30 356/244
6,442,736 B1 8/2002 Girard et al.
(Continued)

FOREIGN PATENT DOCUMENTS

JP H05-29423 A 2/1993
JP 6782140 B2 11/2000
(Continued)

OTHER PUBLICATIONS

Notice of Final Rejection dated Mar. 28, 2025 in corresponding Korean Patent Application No. 10-2023-0015461 and a computer generated English translation obtained from the JPO.
(Continued)

*Primary Examiner* — Duy Vu N Deo
*Assistant Examiner* — Andrew Keelan Laobak
(74) *Attorney, Agent, or Firm* — OSTROLENK FABER LLP

(57) ABSTRACT

An etching method according to the present invention includes a step of creating a reduced pressure state inside of a processing chamber accommodating a substrate, after the step of creating the reduced pressure state, a step of supplying vapor into the processing chamber, after the step of creating the reduced pressure state, a step of supplying an etching gas containing hydrogen fluoride into the processing chamber and etching the coating film formed on the substrate, and in the step of supplying the vapor, a step of detecting OH stretching vibration in the substrate by infrared spectroscopy, in which the step of etching the coating film is performed when the OH stretching vibration of a predetermined threshold value or higher is detected in the substrate. Therefore, the efficiency of the etching process is enhanced.

3 Claims, 6 Drawing Sheets

(51) Int. Cl.

| | |
|---|---|
| ***H10P 74/00*** | (2026.01) |
| ***H10P 74/20*** | (2026.01) |

(56) References Cited

U.S. PATENT DOCUMENTS

| | | | |
|---|---|---|---|
| 2004/0056196 | A1 | 3/2004 | Yoshida et al. |
| 2012/0160274 | A1 | 6/2012 | Kasai et al. |
| 2020/0051828 | A1 | 2/2020 | Yamaguchi |
| 2021/0066071 | A1 | 3/2021 | Then et al. |

FOREIGN PATENT DOCUMENTS

| | | | |
|---|---|---|---|
| JP | 2018-056465 | A | 4/2018 |
| JP | 2019-168460 | A | 10/2019 |
| KR | 10-2002-0026857 | A | 4/2002 |
| KR | 10-2002-0073560 | A | 9/2002 |
| KR | 10-2012-0114410 | A | 10/2012 |
| TW | 201234454 | A | 8/2012 |
| WO | WO 2011/105331 | A1 | 9/2011 |

OTHER PUBLICATIONS

Notice of Decision to Grant with Search Report dated Nov. 14, 2023 in corresponding Taiwanese Patent Application No. 112102149.

U.S. Appl. No. 18/160,730 based on JP 2022/037018, filed Mar. 10, 2022 is a related (co-pending application) to this application.

Notice of Decision to Grant dated Aug. 5, 2025 in corresponding Japanese Patent Application No. 2022-037020.

Request for the Submission of an Opinion dated Jul. 23, 2024 in corresponding Korean Patent Application No. 10-2023-0015461 and an English machine language translation obtained from the Global Dossier.

Notice of Decision to Grant dated Mar. 26, 2026 in corresponding Korean Patent Application No. 10-2023-0015461.

* cited by examiner

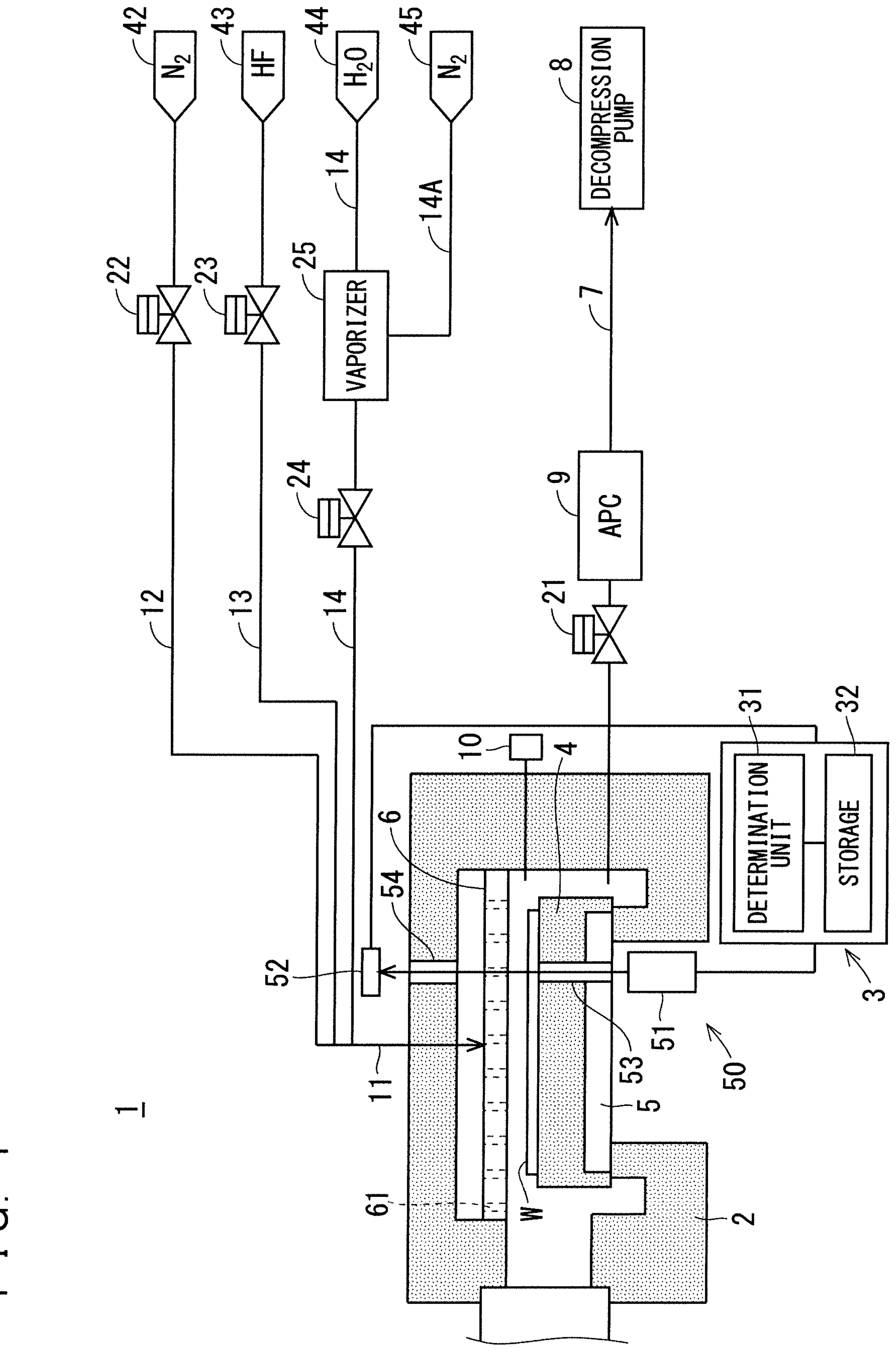
F I G. 1
1
N2
HF
H2O
N2
42
43
44
45
DECOMPRESSION PUMP
8
VAPORIZER
25
22
23
24
14
14A
12
13
14
7
APC
9
21
31
32
DETERMINATION UNIT
STORAGE
3
10
4
6
54
52
53
51
50
11
5
61
W
2

F I G. 2
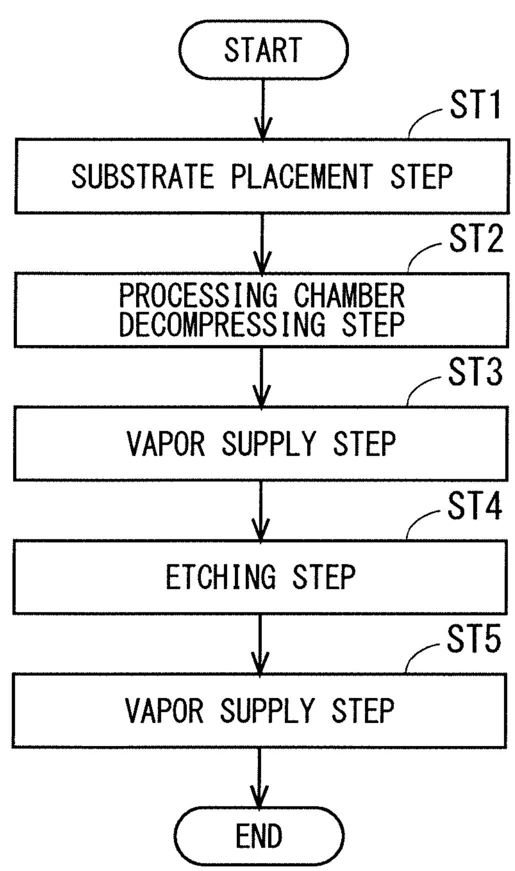

F I G. 3
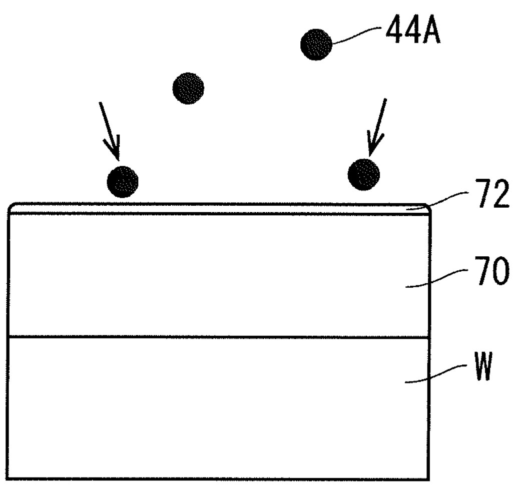

ETCHING METHOD AND ETCHING APPARATUS

BACKGROUND OF THE INVENTION

Field of the Invention

The technique disclosed in the specification of the present application relates to an etching technique for a substrate. A substrate to be subjected to treatment includes, a semiconductor wafer, a glass substrate for liquid crystal display device, a substrate for flat panel display (FPD) such as an organic EL (electroluminescence) display device, an optical disk substrate, a magnetic disk substrate, a magneto-optical disk substrate, a glass substrate for photomask, a ceramic substrate, a substrate for field emission display (FED), and a substrate for solar cell, for example.

Description of the Background Art

A process of etching a coating film formed on a substrate is included in manufacturing processing of a semiconductor device. Coating films formed on substrates include, for example, silicon oxide films and silicon nitride films.

Conventionally, wet etching based on hydrofluoric acid has been adopted for etching silicon oxide films, for example. However, as the pattern to be formed becomes finer along with the progress in the higher integration of semiconductor devices, wet etching causes problems such as the pattern collapsing due to the surface tension of water.

Therefore, a vapor-phase etching technique using hydrofluoric acid vapor or a vapor-phase etching technique using anhydrous gaseous hydrogen fluoride has been adopted (see Japanese Patent No. 6782140, for example).

In the vapor-phase etching technique, gaseous hydrogen fluoride dissolves in water to generate fluorine ions, which contribute to etching.

Therefore, it is desirable that sufficient moisture (such as vapor) exist on the upper surface of the substrate during the etching process. Meanwhile, if the step for supplying water to the upper surface of the substrate (for example, a step of supplying vapor) takes long, which makes the total time required for the etching process is longer, lowering the process efficiency thereof. Therefore, the demand for improving the efficiency of the etching process while retaining sufficient moisture on the upper surface of the substrate has been increasing.

SUMMARY

The present invention is directed to an etching method and an etching apparatus.

An aspect of the present invention is an etching method including the steps of: creating a reduced pressure state inside of a processing chamber accommodating the substrate, after the step of creating the reduced pressure state, supplying vapor into the processing chamber, after the step of creating the reduced pressure state, supplying an etching gas containing hydrogen fluoride into the processing chamber and etching the coating film formed on the substrate, and in the step of supplying the vapor, detecting OH stretching vibration in the substrate by infrared spectroscopy. The step of etching the coating film is performed when the OH stretching vibration of a predetermined threshold value or higher is detected in the substrate.

By detecting the amount of vapor on the upper surface of the substrate before the etching process is performed, the etching process is performed at an appropriate timing. Therefore, the waiting time until the etching process is performed is minimized, improving the efficiency of the etching process.

An aspect of the present invention is an etching apparatus including: a decompression pump configured to create a reduced pressure state inside of a processing chamber accommodating the substrate, an etching gas supply unit configured to supply an etching gas containing hydrogen fluoride into the processing chamber, a vapor supply unit configured to supply vapor into the processing chamber, a detection unit configured to detect OH stretching vibration in the substrate by infrared spectroscopy, and a controller configured to control an operation of at least the etching gas supply unit, the vapor supply unit, and the detection unit. The controller is configured to control the vapor supply unit so that the vapor is supplied into the processing chamber which is in the reduced pressure state, control the detection unit so that the OH stretching vibration is detected in the processing chamber with the vapor being supplied, and control the etching gas supply unit so that the etching gas is supplied into the processing chamber which is in the reduced pressure state when the OH stretching vibration equal to or higher than a predetermined threshold value is detected.

by detecting the amount of vapor on the upper surface of the substrate before the etching process is performed, the etching process is performed at an appropriate timing. Therefore, the waiting time until the etching process is performed is minimized, improving the efficiency of the etching process.

Therefore, an object of the present invention is to enhance the efficiency of the etching process.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a side view schematically illustrating an example of a configuration of an etching apparatus according to an embodiment;

FIG. 2 is a flow chart illustrating an example of an operation of the etching apparatus according to the embodiment;

FIG. 3 is a diagram conceptually illustrating a process in which vapor is supplied to a substrate;

DESCRIPTION OF THE PREFERRED EMBODIMENTS

Figure 4:
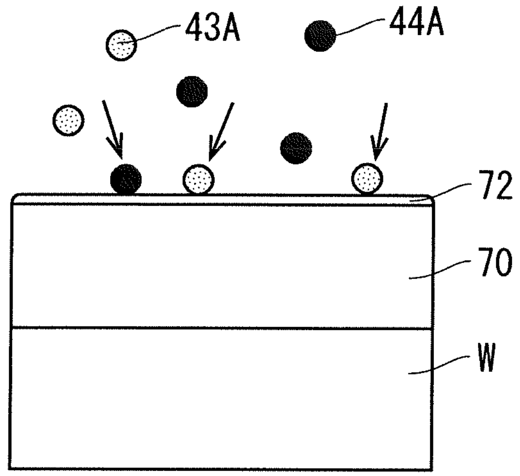
FIG. 4 is a diagram conceptually illustrating the etching process.

Hereinafter, an embodiment will be described with reference to the attached drawings. In the following embodiment, although detailed features and the like are also shown for technical explanation, they are mere examples, and not all the features to be described are essential for the feasibility of the embodiment.

It should be noted that the drawings are schematically illustrated, and for the convenience of explanation, some omissions or simplifications of the configuration may be made in the drawings as appropriate. Also, the mutual relationship among sizes and positions in configurations and the like illustrated in different drawings are not necessarily accurately described, and may be changed as appropriate. In addition, in the drawings such as plan views that are not cross-sectional views, hatching may be given to facilitate understanding of the contents of the embodiment.

In addition, in the following description, the same components are denoted by the same reference numerals, and the names and functions thereof are also similar. Accordingly, detailed descriptions thereof may be omitted to avoid redundancy.

Also, in the description written in the specification of the present application, when it is described that a certain component is “equipped”, “included”, or “an object has a certain component”, etc., such wording does not exclude the existence of another component unless otherwise specified.

Also, in the description written in the specification of the present application, even though ordinal numbers such as “first” and “second” may be used, these terms are for promoting the understanding of the contents and are not for defining the order caused by such ordinal numbers.

Also, in the description to be made in the specification of the present application, even though terms indicating specific positions or directions such as “upper”, “lower”, “left”, “right”, “side”, “bottom”, “front”, and “back” may be used, these terms are for promoting the understanding of the contents of embodiments and are not related to the positions or directions at the time of implementation of the embodiments.

Embodiment

An etching method and an etching apparatus according to an embodiment will be described below.

<Configuration of Etching Apparatus>

FIG. 1 is a side view schematically illustrating an example of a configuration of the etching apparatus according to the present embodiment. An etching apparatus 1 is a single-wafer etching apparatus that processes substrates W such as semiconductor wafers one by one.

In the present embodiment, although the coating film containing silicon to be etched is assumed to be a silicon oxide film, the coating film is not limited thereto, and may be, for example, a silicon nitride film. Also, the silicon oxide film may be a thermal silicon oxide film formed by thermal oxidation, a Tetra Ethoxy Silane (TEOS) film obtained by using a chemical vapor deposition (CVD) method, a Boron Silicate Glass (BSG) film obtained by a CVD method, a silicon oxide film containing a large amount of impurities such as a Phospho Silicate Glass (PSG) film and a Boron doped Phospho Silicate Glass (BPSG) film, or other silicon oxide film, or the like.

As an example is illustrated in FIG. 1, the etching apparatus 1 includes a processing chamber 2 being a chamber or the like for processing a substrate W, and a controller 3 that controls the operation of devices provided in the etching apparatus 1 or the opening and closing of valves. The controller 3 includes a determination unit 31 that performs a predetermined determination based on input information, a storage 32 that stores the input information, the determination result of the determination unit 31, information output from the determination unit 31, and the like.

The processing chamber 2 has a cylindrical shape, for example, and has a processing space in which the substrate W is processed. A substrate holder 4 is installed in the processing chamber 2 to hold the substrate W in a substantially horizontal posture. The substrate W is transported into the processing chamber 2 by a transport system (not illustrated) and then placed on the substrate holder 4.

In the processing chamber 2, the substrate holder 4 that holds the substrate W, a heating mechanism 5 built into the substrate holder 4 that heats the substrate W, a gas distribution plate 6 positioned above the substrate holder 4 in the processing chamber 2, an exhaust pipe 7 connected in communication with the processing chamber 2 to reduce the pressure in the processing chamber 2, a pressure sensor 10 connected to the processing chamber 2, and a pipe 11 (mixed gas pipe) connected in communication with the upper portion of the processing chamber 2 are provided.

The substrate holder 4 may hold the substrate W with a chuck pin or the like, or may have the substrate W attached to the upper surface of the substrate holder 4 by suction.

The substrate W is heated to a predetermined temperature in the range of 30° C. to 200° C. by the heating mechanism 5 built in the substrate holder 4. As the heating mechanism 5, for example, a resistance heating electric heater is assumed.

The gas distribution plate 6 is formed with a plurality of openings 61 and is provided above the substrate W so as to separate the upper portion and the lower portion of the inside of the processing chamber 2. The gas supplied from the pipe 11 is dispersed through the plurality of openings 61 of the gas distribution plate 6 and then supplied below the gas distribution plate 6. In the present embodiment, the plurality of openings 61 having an inner diameter of 0.1 mm are formed in the gas distribution plate 6 at intervals of 5 mm. Note that the inner diameter and the intervals of the openings are not limited thereto. Also, the gas distribution plates 6 may be installed in a plurality of stages.

The pressure sensor 10 is a sensor that measures the pressure (degree of vacuum) in the processing chamber 2, and outputs the pressure measurement result to the controller 3 by wired or wireless communication means.

The exhaust pipe 7 includes a control valve 21, an Auto Pressure Controller (APC) valve 9 positioned downstream of the control valve 21, and a decompression pump 8 positioned downstream of the APC valve 9, and that decompresses the inside of the processing chamber 2 via an exhaust pipe 7. The APC valve 9 controls the pressure inside the processing chamber 2 by adjusting the exhaust flow rate from the processing chamber 2. The determination unit 31 in the controller 3 adjusts the opening degree of the APC valve 9 so that the pressure inside the processing chamber 2 measured by the pressure sensor 10 becomes a desired pressure. Adjusting the pressure in two stages, at the control valve 21 and the APC valve 9, allows accurate pressure adjustment over a wide pressure range. A mechanism where either the control valve 21 or the APC valve 9 is excluded may be adopted depending on the device specifications.

In the present embodiment, although the decompression pump 8 is described as decompression means in the processing chamber 2, the decompression means is not limited thereto, and decompression may be performed by factory utility exhaust, for example.

The pipe 11 is connected to a pipe 12, a pipe 13, and a pipe 14 on the upstream side, and is the pipe where the gas supplied from each pipe merges. The gas merged in the pipe 11 is supplied to the upper portion of the processing chamber 2.

The pipe 12 is provided with a control valve 22 and a nitrogen supply source 42 located upstream of the control valve 22. The control valve 22 controls the flow rate of nitrogen (inert gas) supplied from the nitrogen supply source 42 to the pipe 12.

The pipe 13 is provided with a control valve 23 and a gaseous hydrogen fluoride supply source 42 positioned upstream of the control valve 33. The control valve 23 controls the flow rate of gaseous hydrogen fluoride supplied from the gaseous hydrogen fluoride supply source 43 to the pipe 13. For the gaseous hydrogen fluoride supply source 43, for example, a high-pressure cylinder of anhydrous hydrogen fluoride is used.

The pipe 14 is provided with a control valve 24, a vaporizer 25 positioned upstream of the control valve 24, and a vapor supply source 44 positioned upstream of the vaporizer 25. Further, a nitrogen supply source 45 is provided upstream of a pipe 14A branched from the pipe 14 in the vaporizer 25.

In the vaporizer 25, pure water (DIW) supplied from the vapor supply source 44 is vaporized by nitrogen (inert gas) supplied from the nitrogen supply source 45 and pumped. Then, the control valve 24 controls the flow rate of the vaporized vapor supplied from the pipe 14 to the pipe 11.

The etching apparatus 1 further includes a Fourier-transform infrared spectroscopy (FTIR) 50 as an analyzer that analyzes the inside of the processing chamber 2 by infrared spectroscopy. In the present embodiment, although the FTIR 50 is adopted as the infrared spectrophotometer corresponding to the analyzer, a dispersive infrared spectrophotometer is also adoptable.

The FTIR 50 is arranged below the substrate W and includes a light source 51 that irradiates the substrate W with light from below, and a light receiving unit 52 that receives the light emitted from the light source 51 above the substrate W.

The light emitted from the light source 51 enters the processing chamber 2 through a light projection window 53 provided below the substrate W, and then passes through the substrate W. The light emitted from the light source 51 passes through the opening 61 of the gas dispersion plate 6, reaches the light receiving window 54 provided above the substrate W, and enters the light receiving unit 52 from the light receiving window 54. Here, for example, the opening 61 of the gas dispersion plate 6 is preferably arranged along a straight line connecting the light source 51 and the light receiving unit 52 so that the light emitted from the light source 51 can reach the light receiving unit 52 without being interfered with the gas dispersion plate 6. In the present embodiment, although the light source 51, the light receiving unit 52, and the opening 61 of the gas dispersion plate 6 are arranged at an overlapping position in plan view, the arrangement of the three sides is not limited thereto.

The light projection window 53 and the light receiving window 54 are made of a substance that is transparent to infrared light and has high vacuum resistance (for example, quartz).

The determination unit 31 of the controller 3 calculates the transmission spectrum by Fourier transforming the interferogram of the light received by the light receiving unit 52 of the FTIR 50. The determination unit 31 calculates respective transmission spectra in the state to be measured (for example, the state before vapor is supplied to the substrate W held by the substrate holder 4) and in the reference state (for example, the state after vapor is supplied to the substrate W held by the substrate holder 4), and determines the presence or absence of a sample to be detected based on the difference between them.

In addition to the above, the determination unit 31 of the controller 3 implements the temperature control of the heating mechanism 5 the flow rate control of the control valve 22, the flow rate control of the control valve 23, the flow rate control of the control valve 24, the flow rate control of the control valve 21, the exhaust operation of the decompression pump 8, the measurement operation of the pressure sensor 10, the adjustment of the opening degree of the APC valve 9, and the like in the etching apparatus 1.

The gas supplied from the pipe 11 into the processing chamber 2 is selected from nitrogen, gaseous hydrogen fluoride, and vapor by the controller 3 controlling each control valve. The selected gas passes through the gas distribution plate 6 and reaches the substrate W within the processing chamber 2.

The supply amount of gaseous hydrogen fluoride supplied to etch the coating film such as the silicon oxide film formed on the substrate W is, for example, 100 cc/min to 2000 cc/min. The supply amount of vapor to be mixed with the gaseous hydrogen fluoride is 300 cc/min to 10000 cc/min, for example.

In the step of cleaning the substrate surface after etching the silicon oxide film (described later), the supply amount of vapor is 300 cc/min to 10000 cc/min, for example.

Further, the pressure inside the processing chamber 2 is maintained at, for example, 1 Pa or more and 30000 Pa or less during the processing of the substrate W. Depending on the supply amount of vapor supplied and the supply amount of mixed gas of vapor and gaseous hydrogen fluoride, the controller 3 adjusts the opening degree of the APC valve 9 such that the pressure in the processing chamber 2 indicated by the pressure sensor 10 becomes a predetermined pressure, thereby controlling the pressure in the processing chamber 2.

<Operation of Etching Apparatus>

The operation of the etching apparatus according to the embodiment will be described below. FIG. 2 is a flow chart illustrating an example of the operation of the etching apparatus according to the present embodiment. The following operation is executed under the control of the controller 3.

First, the substrate W is transported into the processing chamber 2 by the transport system (not illustrated) and then placed on the substrate holder 4 (Step ST1). Then after the substrate W is placed on the substrate holder 4, the substrate W is heated to a predetermined temperature in the range of 30° C. to 200° C. by the heating mechanism 5 built in the substrate holder 4.

Next, after the substrate W is placed on the substrate holder 4, the decompression pump 8 starts evacuating the processing chamber 2 (Step ST2). Evacuation is executed until the pressure in the processing chamber 2 reaches approximately 0.1 Pa, and the atmospheric atmosphere in the processing chamber 2 is exhausted.

The evacuation time is determined depending on the capacity of a vacuum pump used for evacuation and the allowable evacuation time. And, if the pressure is reduced as much as possible, the atmosphere inside the processing chamber 2 is exhausted and the inside of the processing chamber 2 becomes cleaner.

Next, after the pressure inside the processing chamber 2 reaches approximately 0.1 Pa, vapor is supplied into the processing chamber 2 through the pipes 14 and 11 (Step ST3). The supply flow rate of vapor is adjusted to a predetermined flow rate by the control valve 24, and vapor is supplied into the processing chamber 2 through the pipe 11.

The pressure in the processing chamber 2 is monitored by the pressure sensor 10 and the controller 3 controls the opening degree of the APC valve 9 based on the pressure indicated by the pressure sensor 10 so that the pressure in the processing chamber 2 reaches a predetermined degree of vacuum. Although the supply time of vapor in Step ST3 is not particularly limited, it need only be a time (for example, about 1 second or more and 10 seconds or less) for forming a thin water layer on the entire surface of the substrate W.

Vapor is supplied to the entire surface of the substrate W through the plurality of openings 61 of the gas distribution plate 6. The vapor reaching the entire surface of the substrate W forms a thin water layer on the upper surface of the substrate W.

FIG. 3 is a diagram conceptually illustrating a process in which vapor is supplied to a substrate. As an example illustrated in FIG. 3, a water film 72 is formed on the upper surface of the silicon oxide film 70 by supplying vapor 44A to the upper surface of the substrate W.

After the vapor is supplied for a predetermined time, gaseous hydrogen fluoride is adjusted to a predetermined supply flow rate by the control valve 23, further, the vaporized vapor is adjusted to a predetermined supply flow rate by the control valve 24, and then, gaseous hydrogen fluoride and vapor are mixed in the pipe 11 to form a mixed gas. Then, the mixed gas is supplied into the processing chamber 2 through the pipe 11.

Next, the mixed gas supplied into the processing chamber 2 passes through the plurality of openings of the gas distribution plate 6 and is uniformly supplied to the entire surface of the substrate W, and furthermore, etches the silicon oxide film formed on the upper surface of the substrate W (Step ST4). That is, the above mixed gas serves as an etching gas.

FIG. 4 is a diagram conceptually illustrating the etching process. As an example is illustrated in FIG. 4, the silicon oxide film 70 formed on the upper surface of the substrate W is etched by the mixed gas of gaseous hydrogen fluoride 43A and the vapor 44A.

The supply flow rates of the vapor 44A and the gaseous hydrogen fluoride 43A are determined in advance according to the film type of the coating film to be etched. For example, when etching the silicon oxide film 70 as in the present embodiment, the supply flow rate of the vapor 44A is set in the range of 300 cc/min to 10000 cc/min, and the supply flow rate of the gaseous hydrogen fluoride 43A is set in the range of 100 cc/min to 2000 cc/min.

In the present embodiment, the vapor 44A is supplied prior to the above mixed gas (etching gas). Therefore, the water film 72 is formed on the upper surface of the substrate W before the gaseous hydrogen fluoride 43A, which is etching species for the silicon oxide film 70, reaches the upper surface of the substrate W. Therefore, the gaseous hydrogen fluoride 43A dissolves in the water film 72 to generate fluorine ions, staring etching immediately.

When the etching of the silicon oxide film 70 by the etching gas ends, the control valve 23 is closed to stop the supply of the etching gas. Meanwhile, after the etching process, the vapor 44A is supplied by adjusting the control valve 24 and supplied into the processing chamber 2 from the pipe 14 (Step ST5).

The vapor 44A supplied after the etching process reaches the entire surface of the substrate W through the plurality of openings 61 of the gas distribution plate 6. Fluorine (SiF-based residues) remaining on the surface of the substrate W is removed by supplying the vapor 44A to the substrate W after the etching of the silicon oxide film 70 to clean (wash away) the substrate.

In the present embodiment, vapor is supplied into the processing chamber 2 after the etching process using the pipe 11 for supplying the etching gas into the processing chamber 2. However, a pipe different from the pipe 11 may be used as the pipe for supplying vapor after the etching process. In such a case, the gaseous hydrogen fluoride remaining inside the pipe 11 when supplying the etching gas is prevented from being supplied into the processing chamber 2 when supplying vapor after the etching process.

<Starting Operation of Etching Process of Substrate>

Figure 5:
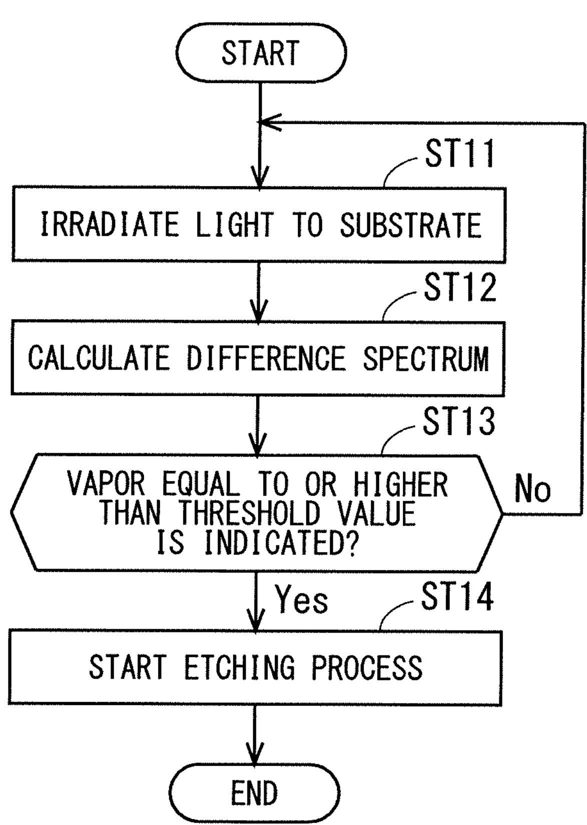
FIG. 5 is a flow chart illustrating an example of a starting operation of the etching process of the substrate.

The starting operation of the etching process (corresponding to Step ST4) of the substrate W in FIG. 2 will be described below. FIG. 5 is a flow chart illustrating an example of the starting operation of the etching process of the substrate W.

First, after vapor starts to be supplied into the processing chamber 2 in Step ST3, the substrate W is irradiated with light (infrared light) from the light source 51 of the FTIR 50 (Step ST11 in FIG. 5). The light emitted from the light source 51 enters the processing chamber 2 through a light projection window 53 provided below the substrate W, and then passes through the substrate W. The light passes through the opening 61 of the gas dispersion plate 6, reaches the light receiving window 54 provided above the substrate W, and enters the light receiving unit 52 from the light receiving window 54.

The light irradiated from the light source 51 is absorbed based on the vibration or rotational motion of molecules present on and above the surface of the substrate W; therefore, the molecules present on and above the surface of the substrate W can detect by comparing the infrared absorption spectrum (measurement spectrum) of the light entered into the light receiving unit 52 through the above-described route with the infrared absorption spectrum (reference spectrum) of the reference light. Note that the reference spectrum corresponds to, for example, the spectrum of light that enters in a state where the substrate W is held before vapor is supplied into the processing chamber 2.

Figure 6:
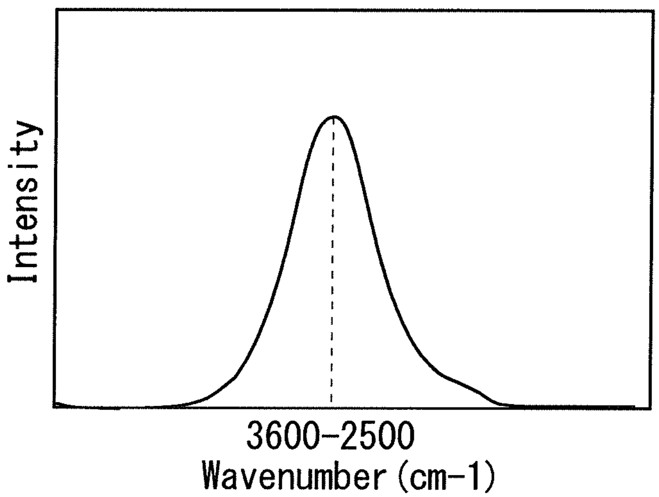
FIG. 6 is a graph conceptually illustrating an infrared absorption spectrum illustrating the OH stretching vibration.

FIG. 6 is a graph conceptually illustrating an infrared absorption spectrum illustrating the OH stretching vibration. In FIG. 6, the vertical axis represents intensity, and the horizontal axis represents wavenumber ($cm^{-1}$). As illustrated in FIG. 6, the infrared absorption spectrum illustrating OH stretching vibration peaks at a value between wavenumbers of 3600 $cm^{-1}$ or more and 2500 $cm^{-1}$ or less.

According to FIG. 6, in the FTIR 50, vapor present on and above the upper surface of the substrate W can be detected, when the infrared absorption spectrum detected as the difference between the measured spectrum and the reference spectrum (difference spectrum) peaks at the value corresponding to the wavenumber of the infrared absorption spectrum illustrating the OH stretching vibration illustrated in FIG. 6. Further, according to the height (intensity) of the peak corresponding to the OH stretching vibration, the substance amount of vapor present on and above the upper surface of the substrate W can be measured. Whether or not a water film is formed on the upper surface of the substrate W can also be estimated from the substance amount of vapor.

Therefore, the determination unit 31 of the controller 3 calculates the measured spectrum by Fourier transforming the interferogram input from the light receiving unit 52, and further calculates the difference spectrum based on the measured spectrum and the reference spectrum stored in the storage 32 in advance (Step ST12 in FIG. 5). Then, the determination unit 31 compares the difference spectrum with the infrared absorption spectrum indicating the OH stretching vibration stored in advance in the storage 32, thereby determining whether or not the difference spectrum indicates the amount of vapor is equal to or higher than a predetermined threshold value (Step ST13 in FIG. 5).

And when the difference spectrum does not indicate the amount of vapor equal to or higher than the threshold value (that is, the difference spectrum does not sufficiently peak at the wavenumber value of the infrared absorption spectrum illustrated in FIG. 6), the determination unit 31 continues the process of supplying vapor into the processing chamber 2 and returns to Step ST11.

On the other hand, when the difference spectrum indicates the amount of vapor equal to or higher than the threshold value (that is, the difference spectrum has peaks of sufficient height at the wavenumber value of the infrared absorption spectrum illustrated in FIG. 6), the determination unit 31 opens the control valve 23 to start etching the substrate W (Step ST14 in FIG. 5).

Here, as the threshold value used in determining whether or not the difference spectrum indicates vapor in Step ST13 above, a value determined in advance by experiments or the like can be used. For example, the substrate W having a thin layer of water (water film 72) formed on the upper surface thereof is used to calculate a measurement spectrum, and a difference spectrum from a common reference spectrum is calculated in advance, and a peak height of the difference spectrum can be adopted as the above threshold value.

The detection of the peak value of the difference spectrum can be started before the etching treatment of the substrate W and can continues even after the start of the etching treatment of the substrate W. By doing so, the etching process is performed with the etching gas being efficiently dissolved in the layer of water (water film 72) while confirming the thin layer of water (water film 72) is formed on the upper surface of the substrate W during the etching process.

At this point, the wavenumber of the Si—F stretching vibration mainly detected from the hydrogen fluoride used for etching the substrate W is, for example, 945 $cm^1$, which is greatly different from the wavenumber of the OH stretching vibration mainly detected from the vapor; therefore, the detection accuracy of OH stretching vibration is not greatly affected.

Meanwhile, the detection of the peak value of the difference spectrum may be limited to before the etching process of the substrate W.

Effect Produced by Embodiment Described Above

Next, an example of effect produced by the embodiment described above is illustrated. In the following description, although the effect will be described based on the specific configuration exemplified in the embodiment described above, the specific configuration may be replaced with other specific configurations exemplified in the specification of the present application as long as the similar effect is produced. That is, hereinafter, for the sake of convenience, although a sole specific configuration of the associated specific configurations may be described as a representative, the specific configuration may also be replaced with the other specific configurations to which the representatively described specific configuration.

According to the embodiment described above, in the etching method, the inside of the processing chamber 2 accommodating the substrate W is brought into a reduced pressure state. Then, the vapor 44A is supplied into the processing chamber 2 after the step of creating the reduced pressure state. After the step of creating the reduced pressure state, the etching gas containing hydrogen fluoride is supplied into the processing chamber 2, and the gaseous hydrogen fluoride is dissolved in the water film 72 formed on the upper surface of the substrate W to etch the coating film formed on the substrate W. Here, the coating film corresponds to, for example, the silicon oxide film 70 or the like. Meanwhile, in the step of supplying the vapor 44A, the OH stretching vibration in the substrate W is detected by infrared spectroscopy. Further, the step of etching the silicon oxide film 70 is performed when the OH stretching vibration of the predetermined threshold value or higher is detected in the substrate W.

According to such a configuration, by detecting the amount of vapor (moisture content) on the upper surface of the substrate W before the etching process is performed, the etching process is performed at timing at which the upper surface of the substrate W is in a state suitable for the etching process (for example, the water film 72 is formed on the upper surface of the substrate W). Therefore, the waiting time until the etching process is performed is minimized, improving the efficiency of the etching process.

Further, according to the embodiment described above, in the etching method, the vapor 44A is supplied into the processing chamber 2 to clean the substrate W after the step of etching the silicon oxide film 70. According to such a configuration, the SiF-based residues remaining on the upper surface of the substrate W are cleaned away after the etching process.

Further, according to the embodiment described above, the step of detecting the OH stretching vibration is the step of detecting the peak height of the spectrum of the wavenumber corresponding to the OH stretching vibration. According to such a configuration, the amount of vapor on the upper surface of the substrate W can be detected with high accuracy according to the peak height of the wavenumber spectrum, and this allows the appropriate determination of the timing of the start of the etching process of the substrate W.

According to the embodiment described above, the etching apparatus includes the decompression pump 8, an etching gas supply unit, a vapor supply unit, a detection unit, and the controller 3. Here, the etching gas supply unit corresponds to a gas supply mechanism that mixes gases supplied from the gaseous hydrogen fluoride supply source 43 and the vapor supply source 44 and supplies the mixture into the processing chamber 2, for example. Also, the vapor supply unit corresponds to a vapor supply mechanism that supplies vapor supplied from the vapor supply source 44 into the processing chamber 2, for example. Also, the detection unit corresponds to the FTIR 50, for example. The decompression pump 8 creates a reduced pressure state inside of the processing chamber 2 accommodating the substrate W. The etching gas supply unit supplies the etching gas containing hydrogen fluoride into the processing chamber 2. The vapor supply unit supplies vapor supplied into the processing chamber 2. The FTIR 50 detects the OH stretching vibrations in the substrate W by infrared spectroscopy. The controller 3 controls at least the operations of the etching gas supply unit, the vapor supply unit, and the FTIR 50. Specifically, the controller 3 controls the vapor supply unit so that the vapor 44A is supplied into the processing chamber 2 which is in the reduced pressure state. Further, the controller 3 controls the FTIR 50 so that the OH stretching vibration is detected in the processing chamber 2 supplied with the water vapor 44A. In addition, the controller 3 controls the etching gas supply unit so that the etching gas is supplied into the processing chamber 2 which is in the reduced pressure state when the OH stretching vibration equal to or higher than the predetermined threshold value is detected.

According to such a configuration, by detecting the amount of vapor (moisture content) on the upper surface of the substrate W before the etching process is performed, the etching process is performed at timing at which the upper surface of the substrate W is in a state suitable for the etching process (for example, the water film 72 is formed on the upper surface of the substrate W). Therefore, the waiting time until the etching process is performed is minimized, improving the efficiency of the etching process.

Also, according to the embodiment described above, the FTIR 50 includes the light source 51 and the light receiving unit 52. Also, the etching apparatus includes a plate portion. Here, the plate portion corresponds to the gas distribution plate 6 or the like, for example. The light source 51 is arranged below the substrate W. The light receiving unit 52 is arranged above the substrate W and receives light output from the light source 51. The gas distribution plate 6 is arranged above the substrate W and has a plurality of openings 61 formed therein. Light emitted from the light source 51 passes through the openings 61 in the gas dispersion plate 6 and is received by the light receiving unit 52. With such a configuration, the light emitted from the light source 51 reaches the light receiving unit 52 without being interfered with the gas dispersion plate 6, so that high detection accuracy of the light spectrum at the FTIR 50 can be maintained.

Modification Example of Embodiment Described Above

In the embodiment described above, although the material, raw material, size, shape, relative arrangement relationship, implementation conditions, etc. of each component may be described, these elements are mere examples in all aspects. and shall not be limiting.

Thus, it is understood that numerous other modification examples and equivalents not having been described can be devised without departing from the scope of the technique disclosed in the specification of the present application. For example, modifying, adding, or omitting at least one component shall be involved.

Further, in the above-described embodiment, when a material name or the like is described without being specified, the material contains other additives, for example, an alloy or the like, so far as consistent with the embodiment.

While the invention has been shown and described in detail, the foregoing description is in all aspects illustrative and not restrictive. It is therefore understood that numerous modifications and variations can be devised without departing from the scope of the invention.

What is claimed is:

1. An etching method of etching a coating film containing silicon formed on a substrate, comprising:

creating a reduced pressure state inside of a processing chamber accommodating the substrate, the reduced pressure state being in a state in which a pressure is lower than atmospheric pressure;

after creating the reduced pressure state, supplying vapor into the processing chamber;

after creating the reduced pressure state, supplying an etching gas containing hydrogen fluoride into the processing chamber and etching the coating film formed on the substrate; and in supplying the vapor, detecting OH stretching vibration in the substrate by infrared spectroscopy, wherein the step of etching the coating film formed on the substrate by supplying the etching gas containing hydrogen fluoride is performed when the OH stretching vibration of a predetermined threshold value which is higher than zero is detected in the substrate.

2. The etching method according to claim 1, further comprising cleaning the substrate after etching the coating film by supplying vapor into the processing chamber.

3. The etching method according to claim 1, wherein detecting the OH stretching vibration is detecting a peak height of a spectrum of a wavenumber corresponding to the OH stretching vibration.

* * * * *